United States Patent
Tao et al.

(10) Patent No.: US 7,414,859 B2
(45) Date of Patent: Aug. 19, 2008

(54) MOUNTING APPARATUS FOR EXPANSION CARD

(75) Inventors: Lang Tao, Shenzhen (CN); Chieh Yang, Tu-Cheng (TW); Li-Ping Chen, Tu-Cheng (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 42 days.

(21) Appl. No.: 11/309,284

(22) Filed: Jul. 21, 2006

(65) Prior Publication Data

US 2008/0030964 A1 Feb. 7, 2008

(51) Int. Cl.
*H05K 7/00* (2006.01)

(52) U.S. Cl. .................. 361/801; 361/802; 361/726; 361/740; 361/759; 361/796

(58) Field of Classification Search .................. 361/726, 361/732, 740, 747, 759, 796, 801
See application file for complete search history.

(56) References Cited

U.S. PATENT DOCUMENTS

| | | | |
|---|---|---|---|
| 5,398,164 A * | 3/1995 | Goodman et al. | 361/752 |
| 6,069,796 A | 5/2000 | Hastings et al. | |
| 6,231,139 B1 | 5/2001 | Chen | |
| 6,357,603 B1 | 3/2002 | Dingman | |
| 6,552,913 B2 | 4/2003 | Tournadre | |
| 2005/0265005 A1 * | 12/2005 | Han et al. | 361/726 |
| 2006/0198115 A1 * | 9/2006 | Chen et al. | 361/796 |

* cited by examiner

*Primary Examiner*—Dean A. Reichard
*Assistant Examiner*—Hoa C Nguyen
(74) *Attorney, Agent, or Firm*—Wei Te Chung

(57) ABSTRACT

A mounting apparatus for an expansion card (30) includes a computer panel (12), a bracket (14) mounted to the computer panel, and a card holder (20) mounted to the bracket. At least a post (1416) is formed on the bracket. The card holder includes a body (22) glidingly mounted to the bracket for installing the expansion card and a handle (24) resisted by the post of the bracket for preventing the body from sliding out so as to fix the card holder in position.

14 Claims, 3 Drawing Sheets

MOUNTING APPARATUS FOR EXPANSION CARD

CROSS-REFERENCE OF THE INVENTION

This application is cross-reference to a copending application entitled "MOUNTING DEVICE FOR EXPANSION CARD", filed at Jul. 13, 2006, and assigned to the same assignee.

1. FIELD OF THE INVENTION

The present invention relates to mounting apparatuses, and more particularly to a mounting apparatus for an expansion card of a computer system.

2. DESCRIPTION OF RELATED ART

Nowadays, most computer systems or other electronic devices employ a plurality of circuit cards, such as expansion cards, adapters, and PC (person computer) boards. These cards or boards are typically mounted to a computer motherboard in a perpendicular fashion relative to the computer motherboard. In particular, the cards are usually inserted into edge card connectors, which are mounted on the computer motherboard. However, merely inserting a card into an edge card connector is typically insufficient to securely maintain the card within the computer chassis. A card connected in this fashion could easily disconnect from the edge card connector, which may prevent, or significantly inhibit, acceptable operation of the computer. Accordingly, additional structure is normally required to secure a card within a computer chassis. A conventional manner of securing a card within a computer chassis is to provide a card bracket fastened to the computer chassis with a removable screw. However, a significant disadvantage of a screw-secured bracket is that the screw is often inadvertently dropped into the computer chassis during installation and removal of the bracket.

Another typical mounting assembly for securing expansion cards includes a rear panel and a fixing cover attached to the rear panel. The rear panel defines a plurality of expansion slots for receiving expansion cards. A fixing plate is stamped from the rear panel adjacent to an end of the expansion slots and forms a plurality of protrusions. Each expansion card includes a slot cover forming a bent portion for abutting against the fixing plate. Each bent portion defines a cutout for engaging with the protrusion of the fixing plate thereby positioning the expansion cards. The fixing cover forms a plurality of elastic tabs for pressing the bent portion of the slot cover thereby fixing the expansion cards. A pair of through holes is defined in the fixing cover and a pair of screw holes is correspondingly defined in the rear panel. A pair of screws extends through the through holes and threadedly engages in the screw holes thereby fixing the fixing cover to the rear panel. However, the above-described operation of the mounting assembly for securing expansion cards is comparatively complicated. Furthermore, the fixing cover has to be released from the rear panel when a new expansion card needs to be inserted into the chassis or some mounted expansion cards need to be taken out of the chassis due to repair or maintenance. Thus, it is possible to cause other expansion cards to come loose, thereby influencing the stability of the computer system in operation.

What is needed, therefore, is a mounting apparatus which readily and firmly secures an expansion card to a computer chassis.

SUMMARY OF THE INVENTION

A mounting apparatus for an expansion card includes a computer panel, a bracket mounted to the computer panel, and a card holder mounted to the bracket. At least a post is formed on the bracket. The card holder includes a body glidingly mounted to the bracket for installing the expansion card and a handle resisted by the post of the bracket for preventing the body from sliding out so as to fixing the card holder to the bracket.

Other advantages and novel features will be drawn from the following detailed description of preferred embodiments with attached drawings, in which:

DETAILED DESCRIPTION OF PREFERRED EMBODIMENTS

Figure 1:
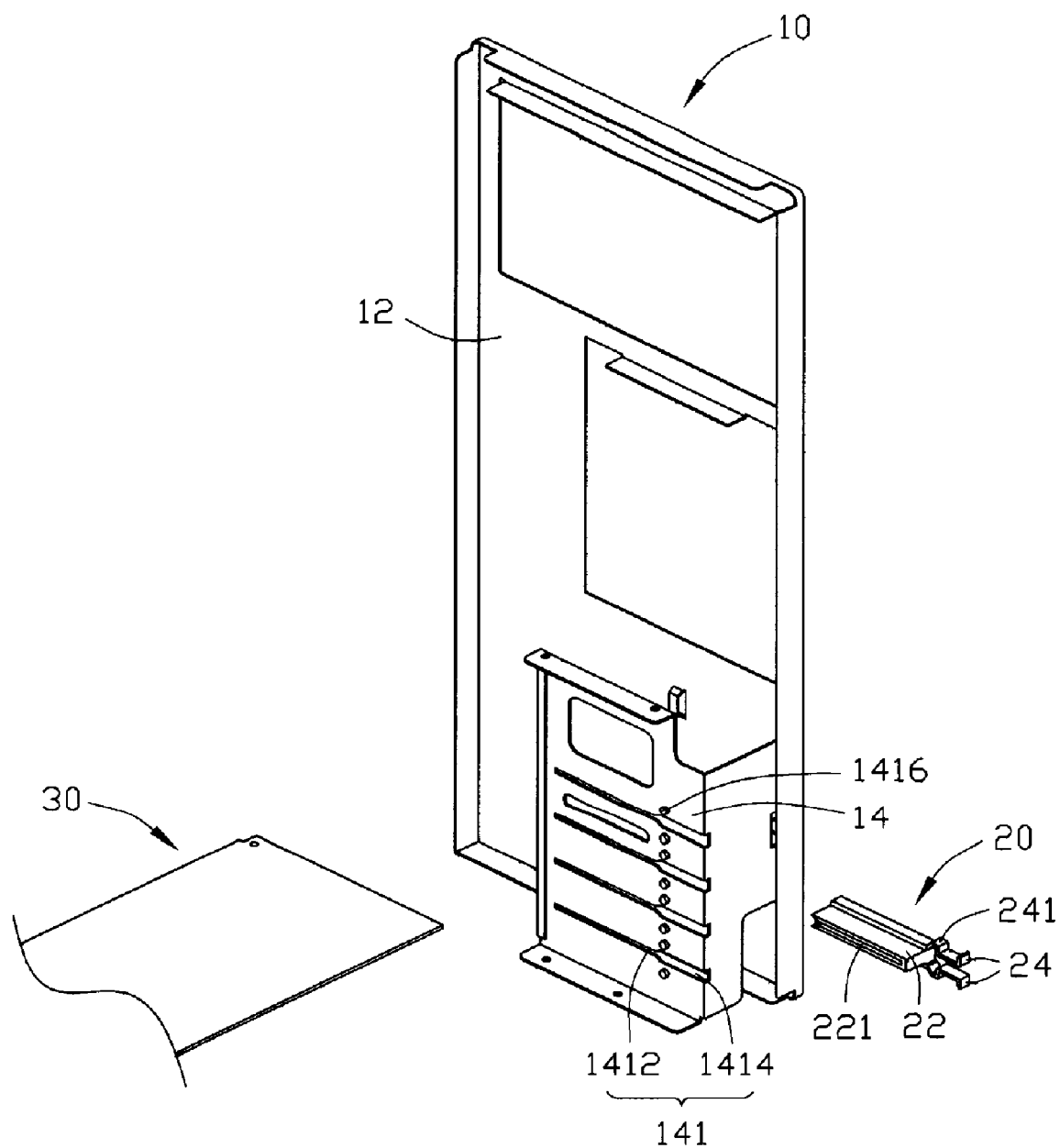
FIG. 1 is an exploded, isometric view of a mounting apparatus of a preferred embodiment of the present invention, together with an expansion card, the mounting apparatus including a computer panel, a bracket, and a card holder.

Referring to FIG. 1, a mounting apparatus of a preferred embodiment of the present invention, for securing an expansion card 30, includes a frame 10 of a computer enclosure, and a card holder 20.

The frame 10 includes a front panel 12 and a bracket 14. A plurality of sliding slots 141 is defined in the bracket 14. Each sliding slot 141 includes a narrow sliding section 1412 and a wide section 1414. A pair of posts 1416 protrudes from the bracket 14, and is respectively located on both sides of the wide section 1414 adjacent to the narrow section 1412 of each sliding slot 141.

Figure 2:
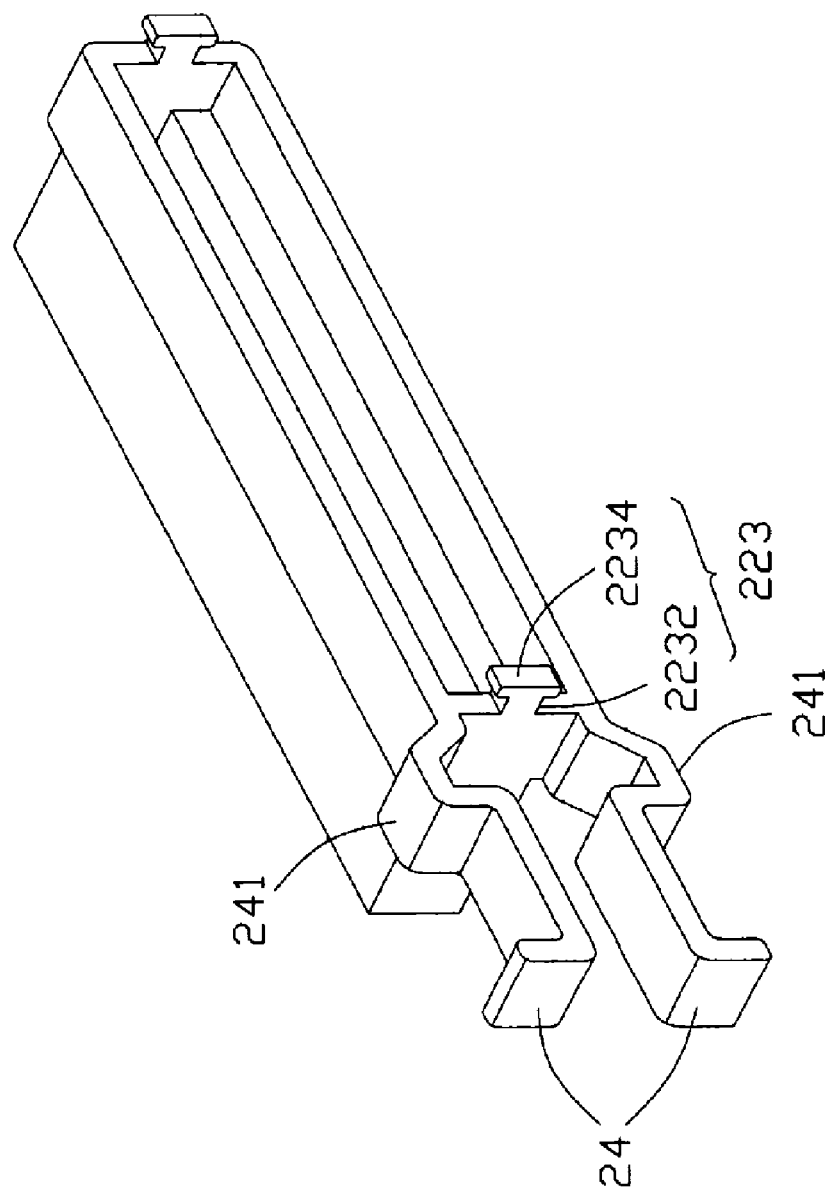
FIG. 2 is an enlarged, isometric view of the card holder of FIG. 1, but viewed from another aspect.

Referring to FIG. 1 and FIG. 2, the card holder 20 includes a body 22 and a pair of elastic handles 24 extending from the body 22. An open card slot 221 is defined in the body 22 of the card holder 20 for positioning the expansion card 30. A pair of sliding blocks 223 is formed on a back surface of the body 22 respectively. Each sliding block 223 includes a sliding portion 2232 protruding from the bottom surface of the body 22, and a retention portion 2234 extending from an end of the sliding portion 2232. The sliding portion 2232 of the sliding block 223 is capable of inserting through and sliding along the sliding section 1412 of the sliding slot 241. The retention portion 2234 is wider than the sliding section 1412 of the sliding slot 141 and narrower than the wide section 1414 of the sliding slot 141. Each of the handles 24 includes a bent portion 241 for cooperating with the post 1416 of the bracket 14. The handles 24 are capable of being deformed oppositely when being pressed and rebounding to an original state when being released.

Figure 3:
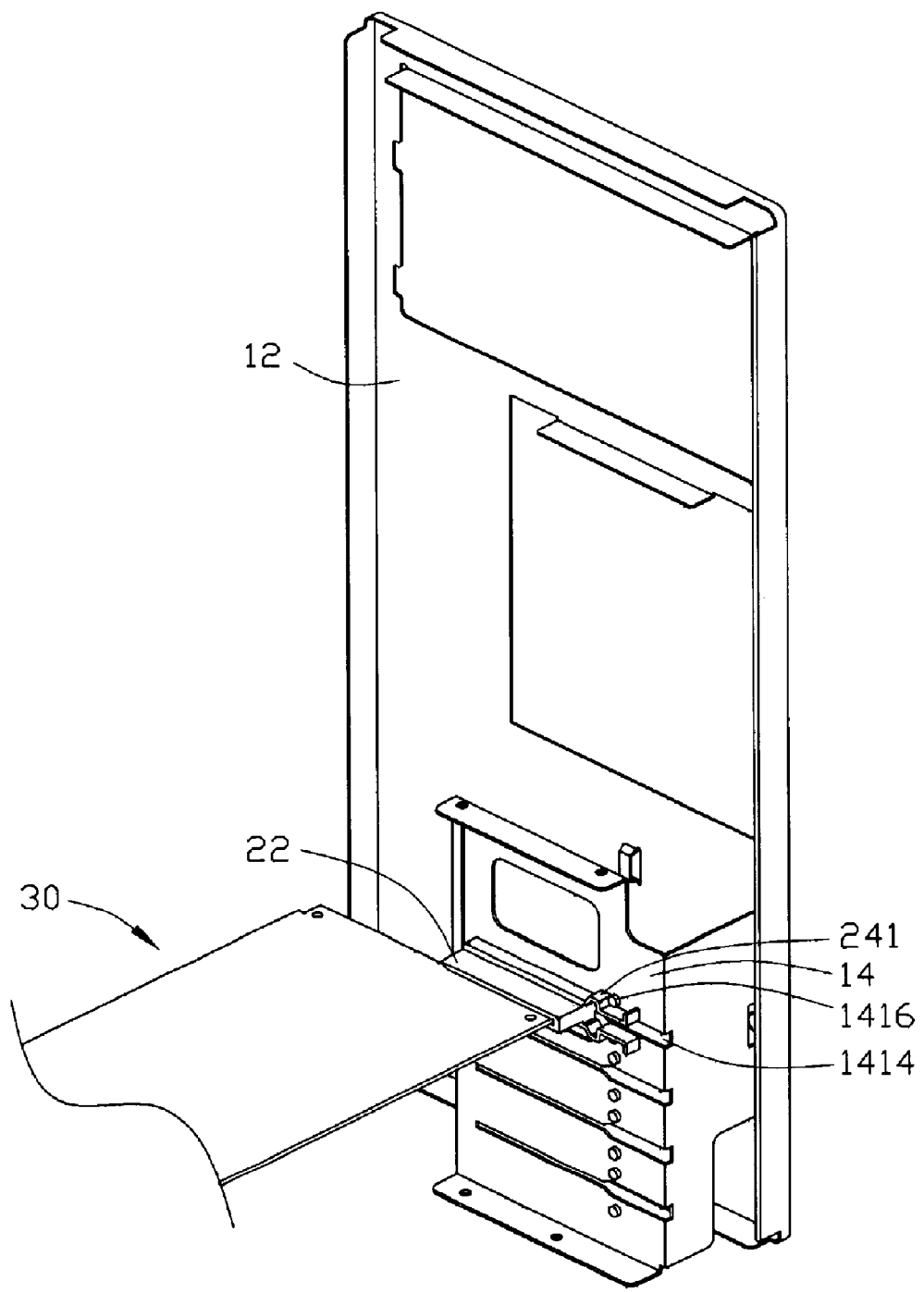
FIG. 3 is an assembled view of FIG. 1.

Referring also to FIG. 3, in assembly of the mounting apparatus, the bracket 14 is secured to the panel 12. The card holder 20 is mounted to the bracket 14. The sliding blocks 223 of the card holder 20 slide into one of the sliding slots 141 from the wide section 1414 while pressing the handles 24 together to allow smooth passage of the bent portions 241 past the posts 1416 of the one of the sliding slots 141. Then the handles 24 are released when the sliding member 223 is in position thus fixing the card holder 20 in position.

In disassembly of the mounting apparatus, the handles 24 are pressed together and the card holder 20 is pulled to slide along the sliding slot 141 until the two sliding blocks 223 are clear of the wide section 1414 of the sliding slot 141 of the bracket 14.

In assembly or disassembly of the expansion card 30, the expansion card 30 is inserted in or taken out from the card slot 221 of the card holder 20.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for an expansion card, comprising:
    a computer panel;
    a bracket mounted to the computer panel, at least an elongated sliding slot being defined in the bracket, and at least a post protruding from the bracket beside the sliding slot; and
    a card holder comprising a body slidingly engaged in the sliding slat of the bracket and an elastic handle extending from one side of the body, the elastic handle being resisted by the post for preventing the body from sliding out from the bracket so as to fix the card holder in position;
    wherein a sliding block inserting into the sliding slot is formed on a back surface of the body of the card holder, and a card slot is defined in the body of the card holder at a front face thereof for positioning one end of the expansion card;
    wherein the sliding block comprises a sliding portion protruding from the back surface of the body and a retention portion extending from an end of the sliding portion, the sliding slot comprises a sliding section for receiving the sliding portion of the sliding block of the card holder and a wide section for allowing insertion of the sliding block of the card holder.

2. The mounting apparatus as described in claim 1, wherein the handle is resisted by the post in a natural state and released by the post in a compressed state.

3. The mounting apparatus as described in claim 2, wherein the handle comprises a bent portion resisted by the post in the natural state.

4. The mounting apparatus as described in claim 3, wherein the bent portion extends from said one side of the body of the card holder and protrudes outward from said one side of the body.

5. The mounting apparatus as described in claim 1, wherein the retention portion is wider than the sliding section and narrower than the wider section of the sliding slot.

6. A mounting assembly, comprising:
    an expansion card;
    a computer panel;
    a bracket mounted to the computer panel, at least a slot being formed in the bracket, a post being formed inwardly at the bracket adjacent to the slot; and
    a card holder comprising an elongated card slot defined therein at a front face thereof for positioning the expansion card and a sliding block formed at a back surface thereof, the sliding block being slidably engaged in the slot of the bracket, the card holder having at least a handle at one side thereof releasably blocked by the post for preventing the sliding block of the card holder sliding out from the slot of the bracket;
    wherein the sliding block comprises a sliding portion formed on the back surface of the body and a retention portion formed on an end of the sliding portion, the sliding slot comprises a narrow sliding section for receiving the sliding portion of the sliding block of the card holder and a wide section for allowing insertion of the retention portion through the sliding slot to slidably engage with one edge of the narrow sliding section.

7. The mounting assembly as described in claim 6, wherein the card holder comprises a body glidingly mounted into the slot for installing the expansion card and the handle extends from one side of a distal end of the body of the card holder.

8. The mounting assembly as described in claim 7, wherein the handle is elastic, and the handle is resisted by the post in a natural state and released from the post in a compressed state.

9. The mounting assembly as described in claim 8, wherein the handle comprises a bent portion projecting therefrom and resisted by the post in the natural state.

10. The mounting assembly as described in claim 9, wherein the bent portion extends from the body of the card holder.

11. The mounting assembly as described in claim 6, wherein the retention portion is wider than the sliding section and narrower than the wide section of the sliding slot.

12. A combination comprising:
    a computer enclosure providing a panel;
    a bracket extending inwardly from the panel;
    a circuit card installed within the computer and perpendicular to the panel, the card having one edge located adjacent to the bracket with a gap formed therebetween; and
    a card holder secured between the card and the bracket at the gap, the card holder comprising a body configured for catching the one edge of the card and an elastic handle extending from the body configured to be detachably secured with the bracket;
    wherein the bracket provides a slideway and the card holder comprises a sliding block being capable of sliding along the slideway;
    wherein the sliding block comprises a narrow portion extending from the body and a wide portion formed at a distal end of the narrow portion, and the slideway comprises a slot comprising a narrow sliding section for slidably receiving the narrow portion of the sliding block and a wide section for allowing insertion of the wide portion of the sliding block through the slot to slidably enaage with edges of the narrow sliding section of the slot.

13. The combination of claim 12, wherein the bracket comprises at least one post protruding inwardly therefrom, the handle comprises a bent section protruding therefrom, and the bent section is resisted by the post when the handle is in a natural state and released from the post when the handle is in a compressed state.

14. The combination of claim 12, wherein an elongated card slot is defined in the body of the card holder, said one edge of the card is received in the card slot.

* * * * *